US009479180B2

(12) United States Patent
Bellitra et al.

(10) Patent No.: US 9,479,180 B2
(45) Date of Patent: Oct. 25, 2016

(54) COMPENSATION DEVICE FOR FEEDBACK LOOPS, AND CORRESPONDING INTEGRATED CIRCUIT

(71) Applicant: STMICROELECTRONICS S.R.L, Agrate Brianza (IT)

(72) Inventors: Matteo Bellitra, Certosa di Pavia (IT); Edoardo Botti, Vigevano (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 0 days.

(21) Appl. No.: 14/796,396

(22) Filed: Jul. 10, 2015

(65) Prior Publication Data

US 2016/0020755 A1 Jan. 21, 2016

(30) Foreign Application Priority Data

Jul. 18, 2014 (IT) ................. TO2014A0568

(51) Int. Cl.
*H03L 5/00* (2006.01)
*H03K 5/003* (2006.01)
*G05F 1/613* (2006.01)
*H03K 19/003* (2006.01)

(52) U.S. Cl.
CPC ............ *H03L 5/00* (2013.01); *G05F 1/613* (2013.01); *H03K 5/003* (2013.01); *H03K 19/00315* (2013.01)

(58) Field of Classification Search
CPC ......... H03K 5/003; H03L 5/00; G05F 1/613; G05F 1/618

USPC ....... 327/306, 331, 332, 362, 363, 538, 540, 327/541, 543, 590
See application file for complete search history.

(56) References Cited

U.S. PATENT DOCUMENTS

| | | | |
|---|---|---|---|
| 7,142,056 B2* | 11/2006 | Blecker | H03F 3/45183 330/253 |
| 7,248,117 B1* | 7/2007 | Li | H03F 1/086 330/260 |
| 7,688,051 B1* | 3/2010 | Li | G05F 1/56 323/280 |
| 7,872,455 B2 | 1/2011 | Moraveji et al. | |
| 8,085,006 B2 | 12/2011 | Burger-Riccio et al. | |
| 9,231,525 B2* | 1/2016 | Feldman | H03F 1/0205 |
| 2007/0069700 A1* | 3/2007 | Moraveji | G05F 3/30 323/223 |
| 2014/0077788 A1 | 3/2014 | Vemula | |
| 2014/0285265 A1* | 9/2014 | Papamichail | H03F 3/16 330/261 |

* cited by examiner

*Primary Examiner* — William Hernandez
(74) *Attorney, Agent, or Firm* — Allen, Dyer, Doppelt, Milbrath & Gilchrist, P.A.

(57) ABSTRACT

An electronic device includes an output terminal, an output transistor having a control terminal and a conduction terminal coupled to the output terminal, and a resistor-capacitor (RC) compensation network configured to act on the control terminal of the output transistor. In addition, the electronic device includes a transconductance amplifier configured to drive the output terminal through the control terminal of the output transistor, and a Miller effect stage coupled to the RC compensation network and having an input port coupled to the transconductance amplifier and an output port coupled to the control terminal of the output transistor.

19 Claims, 3 Drawing Sheets

COMPENSATION DEVICE FOR FEEDBACK LOOPS, AND CORRESPONDING INTEGRATED CIRCUIT

FIELD

The present disclosure relates to compensation techniques for feedback loops. One or more embodiments may apply to monolithic semiconductor circuits operating at high voltage.

BACKGROUND

High-voltage analog systems that have a feedback loop may use a compensation network. For example, the compensation may be obtained with an RC network connected across terminals of a voltage amplifier within the system.

An output swing of this stage may be equal to a supply voltage, so that a capacitor of the RC network may have to sustain this difference of potential applied across it.

However, a capacitance that is able to withstand high voltages in monolithic circuits may not be available. If these capacitances are available, they may prove burdensome in terms of an area of silicon occupied on the monolithic circuit.

Purely by way of example, voltage capabilities of 1.8 V, 5 V, 20 V, and 40 V may correspond to values of capacitance/area ratio (expressed in $nF/mm^2$) of 8.45, 2.37, 0.741, and 0.139, respectively.

A pole-zero compensation may be achieved via an RC network set at an output of an input stage. This may, however, lead to a lower control of the gain of the voltage amplifier as a function of the conditions of load, which may lead to instability in some areas of operation. To avoid this, it may be possible to contemplate reducing the frequency of the compensation pole, with consequent increase in the value of the capacitance and hence in the area of silicon.

SUMMARY

An electronic device includes an output terminal, an output transistor having a control terminal and a conduction terminal coupled to the output terminal, and a resistor-capacitor (RC) compensation network configured to act on the control terminal of the output transistor. In addition, the electronic device includes a transconductance amplifier configured to drive the output terminal through the control terminal of the output transistor, and a Miller effect stage coupled to the RC compensation network and having an input port coupled to the transconductance amplifier and an output port coupled to the control terminal of the output transistor.

BRIEF DESCRIPTION OF THE DRAWINGS

One or more embodiments will now be described, purely by way of non-limiting example, with reference to the annexed figures, in which.

DETAILED DESCRIPTION

Figure 1:
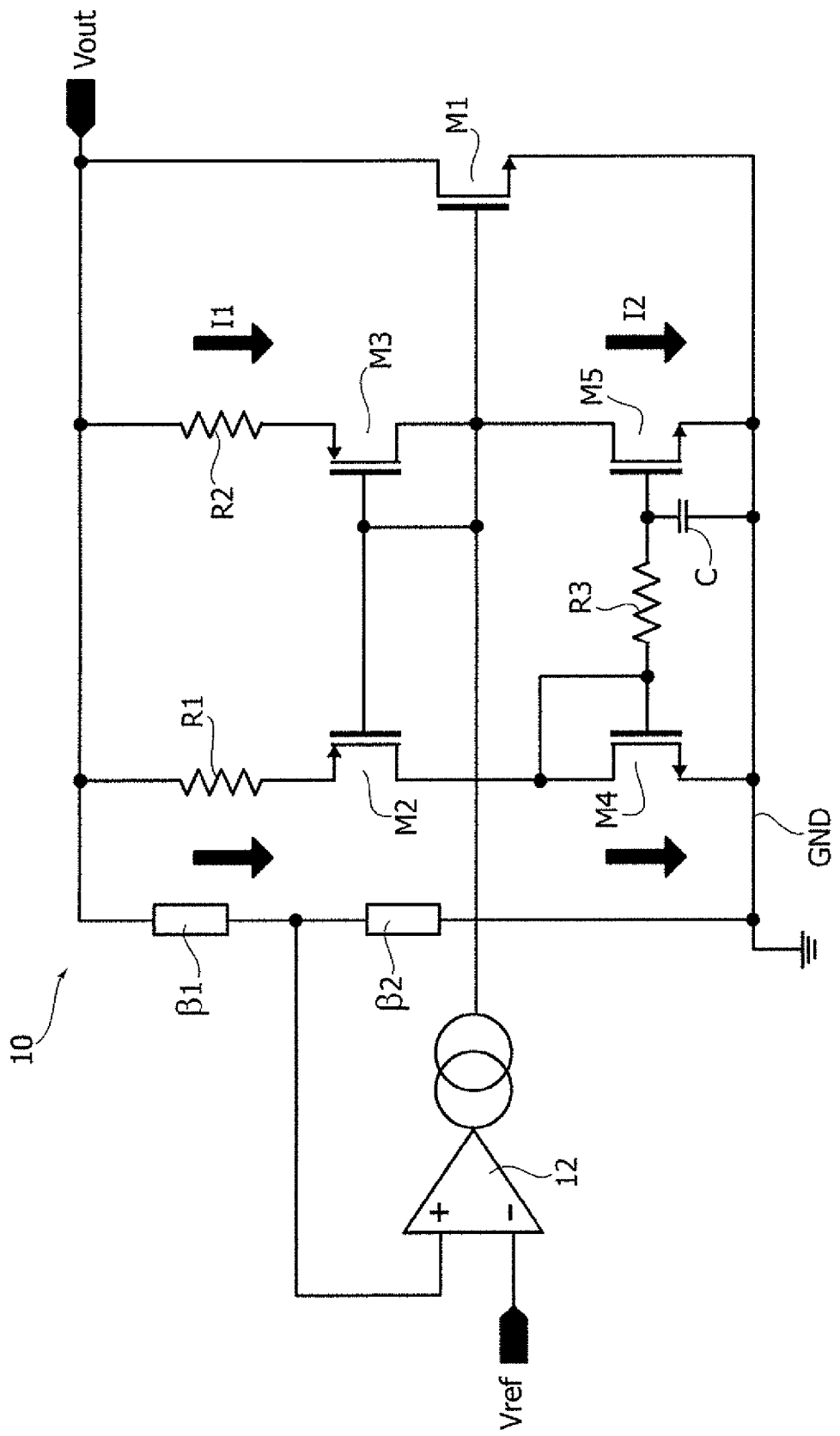
FIG. 1 is a circuit diagram according to one or more embodiments.

In the ensuing description various specific details are illustrated, aimed at providing an in-depth understanding of various examples of embodiments. The embodiments may be obtained without one or more of the specific details, or with other methods, components, materials, etc. In other cases, known structures, materials or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment. Furthermore, particular conformations, structures, or characteristics may be combined in any adequate way in one or more embodiments.

The references used herein are provided merely for convenience and hence do not define the sphere of protection or the scope of the embodiments.

The diagrams of the figures refer to embodiments based upon the use of field-effect transistors (FETs), for example MOSFETs, comprising a control terminal or electrode, referred to as "gate", and a further two terminals, referred to, respectively, as "source" and "drain", through which the path of flow of the current through the transistor is set up (the gate current being in effect negligible).

At least in principle, modalities of operation substantially similar to the ones exemplified hereinafter could be achieved using bipolar transistors, the base of which functions as control terminal or electrode with the path of flow of the current through the transistor set up between the other terminals, referred to as "emitter" and "collector", respectively.

One or more embodiments may also refer to a corresponding integrated circuit, such as for example a monolithic integrated circuit.

One or more embodiments may enable a pole-zero compensation to be obtained by the Miller effect using capacitances capable of withstanding much lower applied voltages.

In one or more embodiments, a pole-zero compensation obtained by the Miller effect on a high-voltage circuit may be implemented through capacitors capable of withstanding a voltage across them even far lower than the voltage that could be envisaged in traditional situations.

One or more embodiments may envisage recourse to a Miller effect stage. This term indicates the effect whereby, in feedback systems with a feedback impedance represented by a capacitor connected between the input and the output of an amplifier, the corresponding value of capacitance when seen from the input end or port, is equivalent to that of a capacitor connected in parallel to the input port itself that has the same value of capacitance as the feedback capacitor multiplied by $(1-A_v)$, where $A_v$ is the voltage gain of the amplifier, and when seen from the output end or port, is equivalent to that of a capacitor connected in parallel to the output port itself that has the same value of capacitance as the feedback capacitor multiplied by $(A_v-1)/A_v$.

In the figures, the reference number 10 designates as a whole a feedback circuit.

In one or more embodiments, the circuit 10 may include, according to a particular architecture, a transconductance amplifier 12, which can be obtained in the form of a differential amplifier (for example, an operational amplifier), which is such as to receive on a first input (for example, an inverting input), a reference signal Vref; and on a second input (for example, a non-inverting input), a feedback signal obtained starting from the signal present on an output terminal Vout via a voltage divider (for example, comprising two resistors β1 and β2) that acts between the output terminal Vout and ground GND.

The transconductance amplifier 12 drives, via its output, the control terminal (gate) of an output transistor M1, which may be constituted, for example, by a field-effect transistor, such as a MOSFET.

An RC compensation network, for example in lowpass configuration, comprising a resistor R3 and a capacitor C, acts on the gate of the output transistor M1 according to the modalities described more fully hereinafter, i.e., in general terms, causing the capacitor C of the aforesaid RC compensation network to be included in a Miller effect stage, the input port of which is connected to the output of the transconductance amplifier 12 and the output port of which drives the gate of the output transistor M1.

In one or more embodiments, as exemplified in the figures, the above Miller effect stage may comprise a circuit scheme substantially resembling a current mirror and including a first pair of transistors M2, M4 and a second pair of transistors M3, M5 (for example, MOSFETs) where each pair comprises two transistors (M2, M4 on one side, and M3, M5 on the other side) set cascaded in a path of current flow between the output terminal Vout and ground GND.

When the two transistors (M2, M4 on one side, and M3, M5 on the other side) are set cascaded in a path of current flow between the output terminal Vout and ground GND, the path of current flow between the output terminal Vout and ground GND passes in one case, between the source and the drain of the transistor M2 and between the source and the drain of the transistor M4; and in the other case, between the source and the drain of the transistor M3 (with a current intensity value $I_1$) and between the source and the drain of the transistor M5 (with a current intensity value $I_2$, where the difference between $I_1$ and $I_2$ expresses the action of compensation performed by the RC compensation network that comprises the resistor R3 and the capacitor C).

In one or more embodiments, for example when the output power stage (transistor M1) is a p-channel stage, the two transistors of the first and second pairs may have opposite polarities, for example, with the transistor M2 being an n-channel transistor and the transistor M4 being a p-channel transistor and with the transistor M3 being an n-channel transistor and the transistor M5 being a p-channel transistor.

In detail, in one or more embodiments, as exemplified herein, the gates (control terminals) of two first transistors (i.e., M2 and M3) of the two pairs may be driven by the output of the transconductance amplifier 12; and the compensation network R3, C—or at least the capacitor C of this compensation network—may be set between the gates of the other two transistors (i.e., the second transistors M4, M5) of the two pairs of transistors; and the gate of the output transistor M1 may be driven by the transistors M3 and M5 starting from a point of the path of current flow that traverses the transistors M3, M5, the point being set between the transistors of the aforesaid second pair (for instance, in the example represented here, between the drains of the two transistors M3 and M5).

In a scheme like the one exemplified in FIG. 1, a first resistor R1 may be set in the path of current flow between the output terminal Vout and ground GND that passes through the transistors M2, M4 of the first pair, while a second resistor R2 may be set in the path of current flow between the output terminal Vout and ground GND that passes through the transistors M3, M5 of the second pair.

In a scheme like the one exemplified in FIG. 1, the compensation current $I_{comp}$ given by the difference between $I_1$ (current through M3) and $I_2$ (current through M5) may be expressed as $$I_{comp} = I_1 - I_2 = \frac{Vrc}{R2} - \frac{Vrc}{R2}\frac{1}{1+sCR3} = \frac{Vrc}{R2}\frac{sCR3}{1+sCR3}$$

which, for $R2 = R3$, is equal to $Vrc\dfrac{sC}{1+sCR3}$ with $Vrc = Vout - Vgs(M1)$ where Vgs(M1) is the gate-to-source voltage of the transistor M1.

What has been described above (on the reasonable basis that it is possible to neglect the value of the ratio 1/gm of the MOSFETs) corresponds to a desired compensation effect. It will be appreciated that the ratio 1/(1+sRC) expresses the transfer function of the RC network (lowpass filter) and/or that the values R3 and C of this filter can be chosen with a certain freedom while keeping the product constant.

Figure 2:
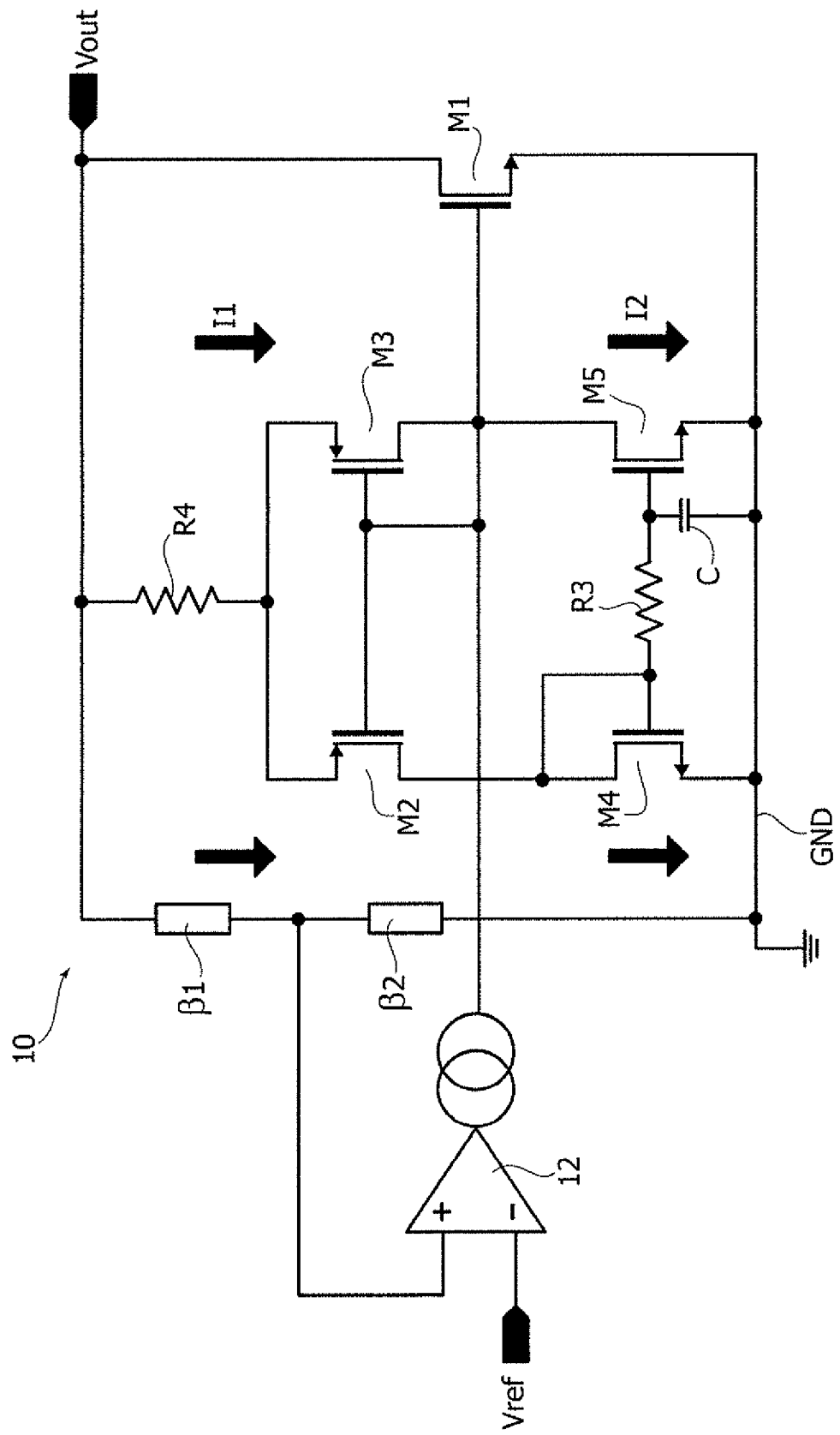
FIG. 2 exemplifies a first variant of the circuit diagram according to one or more embodiments.

FIG. 2 exemplifies one or more embodiments of a variant in which, so to speak, the resistors R1 and R2 have been shortcircuited, so that just one resistor R4 of halved value is sufficient.

More precisely, in one or more embodiments, as exemplified in FIG. 2, the path of current flow between the output terminal Vout and ground GND that passes through the transistors M2, M4 of the first pair, and the path of current flow between the output terminal Vout and ground GND that passes through the transistors M3, M5 of the second pair have a common section along which, as a common resistor, is the resistor R4.

Figure 3:
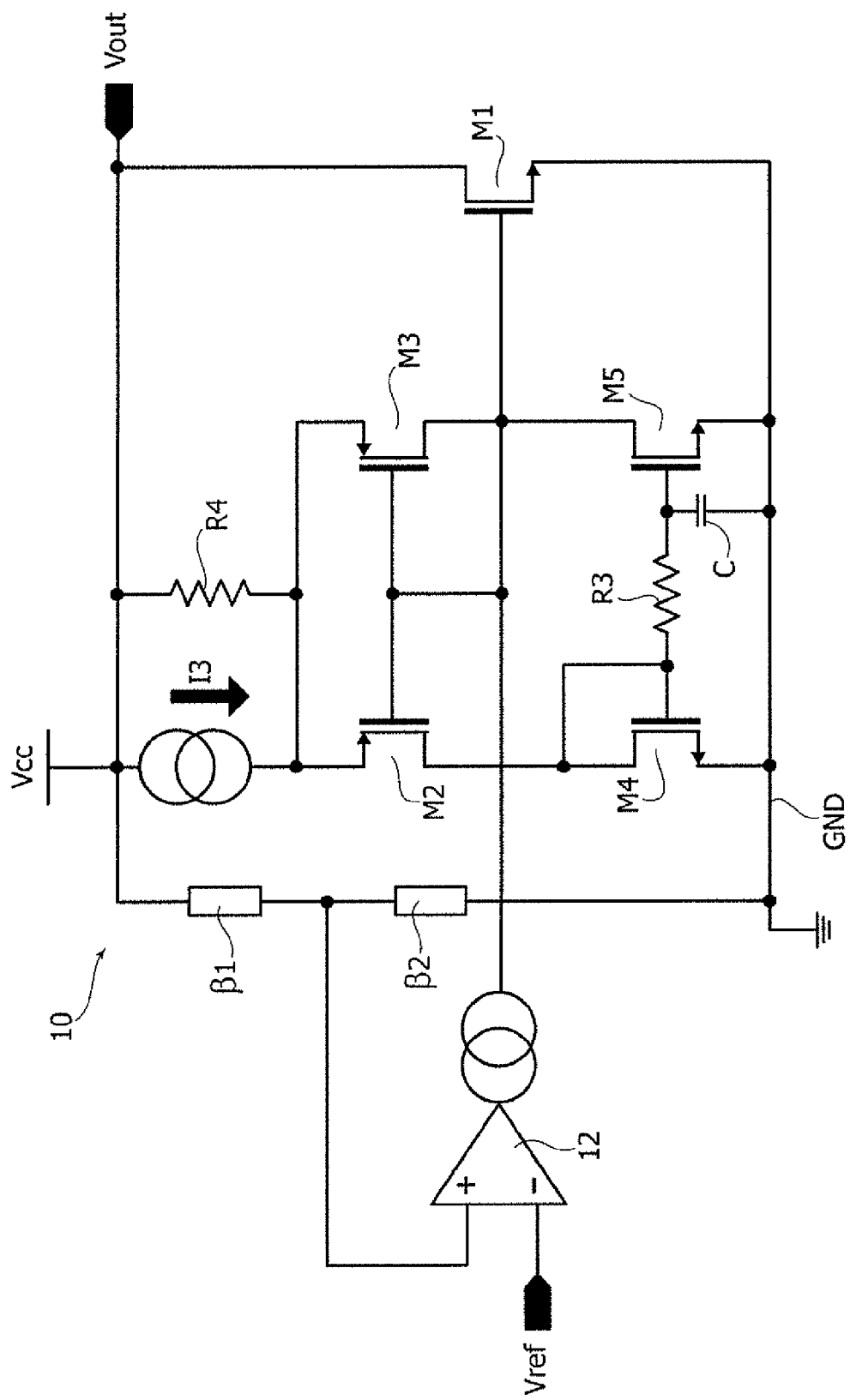
FIG. 3 exemplifies a further variant of the circuit diagram according to one or more embodiments.

FIG. 3 exemplifies one or more embodiments of a variant in which, with an approach that can be applied either to one or more embodiments like the one exemplified in FIG. 2 or to one or more embodiments like the one exemplified in FIG. 1, a current generator $I_3$ (that can be obtained according to known criteria) is provided, which has the function of countering turning off of the circuit formed by the first transistors M2 and M3 (i.e., the ones driven jointly by the output of the transconductance amplifier 12) in the case where the voltage-multiplier transistor, i.e., M1, comes to assume a drain-to-gate voltage $V_{dg}$ lower than a threshold voltage $V_{th}$.

For this purpose, the current generator $I_3$ can operate by generating, across the resistor R3, a voltage drop $\Delta V_R$ greater than $V_{gs}(M1)-V_{ds}(M1)+V_{th}(M3)$, where:

$V_{gs}(M1)$ and $V_{ds}(M1)$ are the gate-to-source voltage and the drain-to-source voltage of M1, respectively; and $V_{th}(M3)$ is the threshold voltage of M3.

Of course, without prejudice to the principles underlying the invention, the details of construction and the embodiments may vary, even significantly, with respect to what has been illustrated herein purely by way of non-limiting example, without thereby departing from the extent of protection.

This extent of protection is defined by the annexed claims.

The invention claimed is:

1. An electronic device comprising:
   an output terminal;
   an output transistor having a control terminal and a conduction terminal coupled to the output terminal;
   a resistor-capacitor (RC) compensation network configured to act on the control terminal of the output transistor;

a transconductance amplifier configured to drive the output terminal through the control terminal of the output transistor; and a Miller effect stage coupled to the RC compensation network in a current flow path between the output terminal and a reference voltage, and having an input port coupled to the transconductance amplifier and an output port coupled to the control terminal of the output transistor.

2. The electronic device of claim 1, wherein the Miller effect stage comprises a first pair of transistors and a second pair of transistors coupled together.

3. The electronic device of claim 2, wherein the first and second pair of transistors each includes respective first and second transistors cascaded in the current flow path between the output terminal and the reference voltage.

4. The electronic device of claim 2, wherein the first transistors of the first and second pairs of transistors have respective control terminals configured to be driven by the transconductance amplifier.

5. The electronic device of claim 2, wherein the capacitor of the RC compensation network is between respective control terminals of the second transistors in the first and second pairs of transistors; and the control terminal of the output transistor is configured to be driven via a point of a current flow path through the second pair of transistors and between the transistors of the second pair of transistors.

6. The electronic device of claim 2, further comprising:

a first resistor in the current flow path between the output terminal and the reference voltage passing through the first pair of transistors; and a second resistor in the current flow path between the output terminal and the reference voltage passing through the second pair of transistors.

7. The electronic device of claim 5, wherein the current flow path between the output terminal and the reference voltage passing through the first pair of transistors and the current flow path between the output terminal and the reference voltage passing through the second pair of transistors have a common section, and a common resistor is in the common section.

8. The electronic device of claim 3, further comprising a current generator to counter turning-off of the first transistors that are driven by the transconductance amplifier.

9. The electronic device of claim 3, wherein the RC compensation network comprises a low-pass RC network.

10. The electronic device of claim 9, wherein the low-pass RC network is between the control terminals of the second transistors of the first and second pairs of transistors.

11. The electronic device of claim 2, wherein the first pair of transistors and the second pair of transistors include transistors of opposite polarities.

12. The electronic device of claim 2, wherein the output transistor, the first and second pairs of transistors are field effect transistors having a gate acting as the control terminal and having a current flow path between source and drain.

13. The electronic device of claim 1, further comprising a semiconductor substrate; and wherein the output transistor, transconductance amplifier, and Miller effect stage are on the semiconductor substrate.

14. An electronic device comprising:

an output terminal;

an output transistor having a control terminal and a conduction terminal coupled to the output terminal;

a resistor-capacitor (RC) compensation network;

a transconductance amplifier coupled to the control terminal of the output transistor; and a Miller effect stage coupled to the RC compensation network in a current flow path between the output terminal and a reference voltage, and having an input port coupled to the transconductance amplifier and an output port coupled to the control terminal of the output transistor.

15. The electronic device of claim 14, wherein the Miller effect stage comprises a first pair of transistors and a second pair of transistors coupled thereto.

16. The electronic device of claim 15, wherein the first and second pair of transistors each includes respective first and second transistors cascaded in the current flow path between the output terminal and the reference voltage.

17. A method of providing compensation with a device comprising an output terminal, an output transistor having a control terminal and a conduction terminal coupled to the output terminal, a resistor-capacitor (RC) compensation network, a transconductance amplifier coupled to the control terminal of the output transistor, and a Miller effect stage coupled to the RC compensation network in a current flow path between the output terminal and a reference voltage, and having an input port coupled to the transconductance amplifier and an output port coupled to the control terminal of the output transistor, the method comprising:

driving the output terminal through the control terminal of the output transistor via the transconductance amplifier; and acting on the control terminal of the output transistor via the RC compensation network.

18. The method of claim 17, wherein the Miller effect stage comprises a first pair of transistors and a second pair of transistors coupled thereto.

19. The method of claim 18, wherein the first and second pair of transistors each includes respective first and second transistors cascaded in the current flow path between the output terminal and the reference voltage.

* * * * *

UNITED STATES PATENT AND TRADEMARK OFFICE
CERTIFICATE OF CORRECTION

PATENT NO.       : 9,479,180 B2                                Page 1 of 1
APPLICATION NO.  : 14/796396
DATED            : October 25, 2016
INVENTOR(S)      : Bellitra et al.

It is certified that error appears in the above-identified patent and that said Letters Patent is hereby corrected as shown below:

In the Claims

| | |
|---|---|
| Column 5, Line 17, Claim 4 | Delete: "2" Insert --3-- |
| Column 5, Line 21, Claim 5 | Delete: "2" Insert --4-- |
| Column 5, Line 29, Claim 6 | Delete: "2" Insert --5-- |

Signed and Sealed this
Fourteenth Day of February, 2017

Michelle K. Lee
*Director of the United States Patent and Trademark Office*